(12) United States Patent
Shih et al.

(10) Patent No.: US 11,201,080 B2
(45) Date of Patent: Dec. 14, 2021

(54) EPITAXY SUBSTRATE AND METHOD OF MANUFACTURING THE SAME

(71) Applicant: GlobalWafers Co., Ltd., Hsinchu (TW)

(72) Inventors: Ying-Ru Shih, Hsinchu (TW); Chih-Yuan Chuang, Hsinchu (TW); Chi-Tse Lee, Hsinchu (TW); Chun-I Fan, Hsinchu (TW); Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/354,188

(22) Filed: Mar. 15, 2019

(65) Prior Publication Data
US 2019/0304831 A1 Oct. 3, 2019

(30) Foreign Application Priority Data
Apr. 3, 2018 (TW) ................. 107111728

(51) Int. Cl.
| | |
|---|---|
| *H01L 29/06* | (2006.01) |
| *H01L 21/762* | (2006.01) |
| *H01L 29/04* | (2006.01) |
| *H01L 21/02* | (2006.01) |
| *B32B 3/02* | (2006.01) |
| *B32B 18/00* | (2006.01) |
| *H01L 21/265* | (2006.01) |

(52) U.S. Cl.
CPC .......... *H01L 21/76251* (2013.01); *B32B 3/02* (2013.01); *B32B 18/00* (2013.01); *H01L 21/02021* (2013.01); *H01L 21/26506* (2013.01); *H01L 29/04* (2013.01); *H01L 29/0603* (2013.01); *B32B 2250/02* (2013.01); *B32B 2307/20* (2013.01)

(58) Field of Classification Search
CPC .. H01L 29/0657; H01L 29/04; H01L 29/0603
See application file for complete search history.

(56) References Cited

U.S. PATENT DOCUMENTS

| | | | | |
|---|---|---|---|---|
| 2011/0045611 | A1* | 2/2011 | Castex | H01L 21/76251 438/5 |
| 2013/0049178 | A1* | 2/2013 | Kerwin | H01L 27/0921 257/657 |
| 2014/0106649 | A1* | 4/2014 | Kim | H01L 21/02016 451/54 |

(Continued)

FOREIGN PATENT DOCUMENTS

| | | |
|---|---|---|
| CN | 108695341 | 10/2018 |
| JP | 2017504210 | 2/2017 |

(Continued)

*Primary Examiner* — Michele Fan
(74) *Attorney, Agent, or Firm* — JCIPRNET (57) ABSTRACT

An epitaxy substrate and a method of manufacturing the same are provided. The epitaxy substrate includes a device substrate and a handle substrate. The device substrate has a first surface and a second surface opposite to each other, and a bevel disposed between the first and the second surfaces. The handle substrate is bonded to the second surface of the device substrate, wherein the oxygen content of the device substrate is less than the oxygen content of the handle substrate, and a bonding angle greater than 90° is between the bevel of the device substrate and the handle substrate.

14 Claims, 5 Drawing Sheets

(56) References Cited

U.S. PATENT DOCUMENTS

| | | | |
|---|---|---|---|
| 2016/0104622 A1* | 4/2016 | Oefner | H01L 29/66348 |
| | | | 257/758 |
| 2016/0351437 A1 | 12/2016 | Peidous et al. | |
| 2018/0114715 A1* | 4/2018 | Iyechika | C30B 25/12 |
| 2018/0286664 A1 | 10/2018 | Fan et al. | |
| 2019/0080957 A1* | 3/2019 | Peidous | H01L 21/76243 |

FOREIGN PATENT DOCUMENTS

| | | |
|---|---|---|
| KR | 20160111495 | 9/2016 |
| TW | 201539651 | 10/2015 |
| TW | 201837991 | 10/2018 |
| WO | 2015112308 | 7/2015 |

* cited by examiner

EPITAXY SUBSTRATE AND METHOD OF MANUFACTURING THE SAME

CROSS-REFERENCE TO RELATED APPLICATION

This application claims the priority benefit of Taiwan application Ser. No. 107111728, filed on Apr. 3, 2018. The entirety of the above-mentioned patent application is hereby incorporated by reference herein and made a part of specification.

BACKGROUND

Technical Field

The disclosure relates to a substrate and a method of manufacturing the same, and more particularly to an epitaxy substrate and a method of manufacturing the same.

Description of Related Art

Epitaxy refers to a technique of growing new crystals on a wafer to form a semiconductor layer. Since a film formed by an epitaxial process has advantages such as high purity, good thickness control and the like, epitaxy has been widely used in the manufacture of radio frequency (RF) devices or power devices.

Currently, silicon-on-insulator (SOI) wafers are used in epitaxial technology. However, due to high-speed rotation of the machine, a junction of an SOI wafer may easily collide with a carrier to cause problems of chipping and contamination, and defects may occur at a wafer edge. Such defects can affect subsequently formed devices and result in poor device quality.

In the epitaxial process, since the maximum stress tends to be applied to a substrate edge, both epitaxial cracks and slip lines of the substrate extend from the substrate edge toward the center of an epitaxial surface.

In addition, at an epitaxy-substrate interface, there is often a problem of interface loss of the epitaxy-substrate interface, resulting from spontaneous polarization induced by an epitaxial material itself, piezoelectric polarization induced by lattice mismatch between the epitaxy and the substrate, or diffusion of epitaxial layer atoms to the substrate.

Further, more seriously, if the stress between the epitaxy substrate and the epitaxial layer is too large, the substrate can crack.

In addition, if the required epitaxy substrate is an SOI substrate, a highly conductive charge inversion layer or accumulation layer is likely to form at an interface between a buried oxide (BOX) layer and the substrate, which may decrease the resistivity of the substrate and cause parasitic power loss.

In general, a high-resistivity substrate has a relatively poor bending strength and is therefore prone to breakage. Moreover, a subsequent high-temperature process may cause thermal donors to be formed on a substrate containing, for example, oxygen atoms, thus causing a decrease in the resistivity of the substrate. Therefore, in order to meet subsequent customer requirements, a "high-resistivity, high-strength and low-oxygen" wafer is to be designed.

SUMMARY

The disclosure provides an epitaxy substrate capable of preventing the problems of chipping and contamination at a junction of a wafer, thereby improving the problem that defects are likely to occur at a wafer edge during epitaxy, and having characteristics such as high resistivity, high strength and low oxygen.

The disclosure further provides a method of manufacturing an epitaxy substrate, the method being suitable for manufacturing an epitaxy substrate having high resistivity, high strength and low oxygen.

An epitaxy substrate of the disclosure includes a device substrate and a handle substrate. The device substrate has a first surface and a second surface opposite to each other, and a bevel disposed between the first surface and the second surface. The handle substrate is bonded to the second surface of the device substrate, wherein an oxygen content of the device substrate is less than an oxygen content of the handle substrate, and a bonding angle greater than 90° is provided between the bevel of the device substrate and the handle substrate.

In one embodiment of the disclosure, a resistivity of the device substrate is greater than a resistivity of the handle substrate.

In one embodiment of the disclosure, the resistivity of the device substrate is greater than 100 ohm-cm.

In one embodiment of the disclosure, a thickness of the device substrate is between 100 μm and 200 μm.

In one embodiment of the disclosure, an error value of crystal orientation of the device substrate is less than ±0.05 degree.

In one embodiment of the disclosure, the bonding angle is 100° to 170°.

In one embodiment of the disclosure, a projection length of the bevel toward the handle substrate is between 600 μm and 800 μm.

In one embodiment of the disclosure, the oxygen content of the device substrate is less than 5 ppma.

In one embodiment of the disclosure, the epitaxy substrate further includes a bonding layer disposed between the handle substrate and the device substrate.

In one embodiment of the disclosure, the epitaxy substrate further includes a charge trapping layer disposed between the handle substrate and the bonding layer.

In one embodiment of the disclosure, the epitaxy substrate further includes a protective layer disposed on a surface of the handle substrate that is not bonded to the device substrate.

In one embodiment of the disclosure, after annealing at 450° C. for one hour, the resistivity of the device substrate is greater than the resistivity of the handle substrate.

In one embodiment of the disclosure, after a heat treatment at 720° C. for two minutes, the resistivity of the device substrate is greater than the resistivity of the handle substrate.

In one embodiment of the disclosure, a diameter of the handle substrate and a diameter of the second surface of the device substrate are different by 0.2 mm or more.

In one embodiment of the disclosure, the epitaxy substrate further includes an implantation region located within the first surface of the device substrate, wherein a distance between the implantation region and the first surface is approximately 10 nm to 95 nm.

In one embodiment of the disclosure, a maximum deformation amount of the handle substrate is less than 6.5 mm.

A method of manufacturing an epitaxy substrate of the disclosure includes the following. A handle substrate is provided. In addition, a beveling treatment is performed on an edge of a device substrate such that a bevel is formed at the edge of the device substrate. An ion implantation process is performed on a first surface of the device substrate to form an implantation region within the first surface. A second surface of the device substrate is bonded to the handle substrate to form the epitaxy substrate, wherein a bonding angle greater than 90° is provided between the bevel of the device substrate and the handle substrate.

In another embodiment of the disclosure, a distance between the implantation region and the first surface is approximately 10 nm to 95 nm.

In another embodiment of the disclosure, a method of providing the handle substrate includes doping carbon, nitrogen or a combination thereof during crystal growth.

In another embodiment of the disclosure, after the handle substrate is provided, a protective layer is further formed on a surface of the handle substrate that is not bonded to the device substrate.

In another embodiment of the disclosure, in a method of bonding the second surface of the device substrate to the handle substrate, the bonding between the second surface of the device substrate and the handle substrate may further be performed through a bonding layer.

In another embodiment of the disclosure, before the second surface of the device substrate is bonded to the handle substrate, a charge trapping layer is further formed on a surface of the handle substrate that is bonded to the device substrate.

Based on the above, in the epitaxy substrate of the disclosure, due to the design of the bevel in the device substrate, the collision between the wafer junction and a carrier for carrying the epitaxy substrate can be prevented, and thus the problems of chipping and contamination can be avoided. Accordingly, the problem that defects are likely to occur at a wafer edge during wafer epitaxy can be solved. Moreover, in the disclosure, since the oxygen content of the device substrate is less than the oxygen content of the handle substrate, the resistivity of the device substrate can be greater than the resistivity of the handle substrate, and the handle substrate is a high-strength substrate. Thus, an epitaxy substrate having high resistivity, high strength and low oxygen can be realized. Further, if an implantation region is disposed within the device substrate, the problem of interface loss at an epitaxial interface due to spontaneous or piezoelectric polarization or diffusion of epitaxial layer atoms to the substrate can be solved. By disposing the bonding layer between the device substrate and the handle substrate, devices can be insulated to reduce leakage current. By disposing the charge trapping layer between the bonding layer and the handle substrate, it can be prevented that the device substrate has a negative charge due to the bonding layer and thus decreases the resistivity of the substrate. In addition, by disposing the protective layer on a back surface of the handle substrate, the stress effect generated in the epitaxial process can be reduced and the epitaxy substrate can be prevented from cracking.

To make the aforementioned more comprehensible, several embodiments accompanied with drawings are described in detail as follows.

DESCRIPTION OF THE EMBODIMENTS

Exemplary embodiments of the disclosure will be described comprehensively below with reference to the drawings, but the disclosure may be embodied in many different forms and should not be construed as being limited to the embodiments described herein. For clarity, in the drawings, sizes and thicknesses of regions, portions and layers are not illustrated in accordance with actual proportions. To facilitate understanding, the same components will hereinafter be denoted by the same reference numerals.

Figure 1:
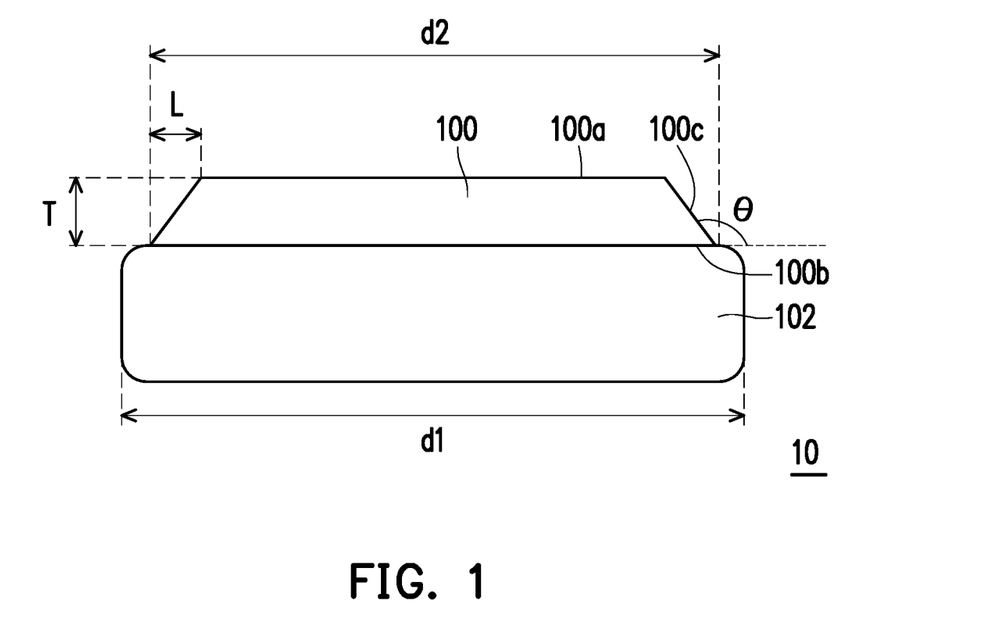
FIG. 1 is a schematic cross-sectional view of an epitaxy substrate according to a first embodiment of the disclosure.

FIG. 1 is a schematic cross-sectional view of an epitaxy substrate according to a first embodiment of the disclosure.

Referring to FIG. 1, an epitaxy substrate 10 of the first embodiment includes a device substrate 100 and a handle substrate 102. The device substrate 100 has a first surface 100*a* and a second surface 100*b* opposite to each other, and a bevel 100*c* disposed between the first surface 100*a* and the second surface 100*b*. The handle substrate 102 is bonded to the second surface 100*b* of the device substrate 100, wherein an oxygen content of the device substrate 100 is less than an oxygen content of the handle substrate 102, a bonding angle θ greater than 90° is provided between the bevel 100*c* and the handle substrate 102, and the bonding angle θ is, for example, between 100° and 170°. In one embodiment, the oxygen content of the device substrate 100 is, for example, less than 5 ppma; in another embodiment, the oxygen content of the device substrate 100 is between 3 ppma and 4 ppma. In the first embodiment, due to the presence of the bevel 100*c*, chipping and contamination can be prevented from occurring at the wafer junction, namely a junction between the handle substrate 102 and the device substrate 100. Moreover, a problem that defects easily occur at a wafer edge during wafer epitaxy can be improved. A projection length L of the bevel 100*c* toward the handle substrate 102 is, for example, between 600 μm and 800 μm.

In addition, a diameter d1 of the handle substrate 102 and a diameter d2 of the second surface 102*b* of the device substrate 100 are, for example, different by 0.2 mm or more. In one embodiment, the diameter d1 of the handle substrate 102 and the diameter d2 of the second surface 102*b* of the device substrate 100 are different by 0.2 mm to 6 mm; that is, a difference in diameter on one side between the handle substrate 102 and the second surface 102*b* of the device substrate 100 is 0.1 mm to 3 mm. However, the disclosure is not limited thereto.

In FIG. 1, a resistivity of the device substrate 100 is greater than a resistivity of the handle substrate 102, and the resistivity of the device substrate 100 is, for example, greater than 100 ohm-cm. In another embodiment, the resistivity of the device substrate 100 is greater than 500 ohm-cm; in still another embodiment, the resistivity of the device substrate 100 is greater than 5,000 ohm-cm. The resistivity of the handle substrate 102 is not particularly limited and may be, for example, within a range in which an RF device (1,800 to 4,000 ohm-cm) or a high electron mobility transistor (HEMT) device (<1 mohm-cm) can be applied.

A thickness T of the device substrate 100 may be between 100 μm and 200 μm, for example, greater than 100 μm and less than 200 μm. When the thickness T of the device substrate 100 is greater than 100 μm, the device substrate 100 has sufficient thickness, and the handle substrate 102 may be subsequently removed in the process according to customer requirements. The above device substrate 100 may preferably have a crystal orientation of (111) according to subsequent epitaxial requirements. However, the disclosure is not limited thereto. An error value of crystal orientation of the device substrate 100 is, for example, less than ±0.05 degree, preferably less than ±0.03 degree. When the error value of crystal orientation of the device substrate 100 is less than ±0.05 degree, epitaxial quality can be improved.

In the disclosure, the oxygen content of the device substrate 100 is less than the oxygen content of the handle substrate 102. The oxygen content of the device substrate 100 is, for example, less than 5 ppma, preferably between 3 ppma and 4 ppma. Alternatively, a silicon wafer formed by a floating zone (FZ) method and having a very low oxygen content may be used. The oxygen content of the handle substrate 102 located below is not particularly limited. In this way, a decrease in the resistivity of the device substrate 100 caused by thermal donors formed from a reaction between oxygen atoms and silicon atoms after a heat treatment can be prevented. Therefore, in one embodiment, after annealing at 450° C. for one hour, the resistivity of the device substrate 100 is still greater than the resistivity of the handle substrate 102; in another embodiment, after a heat treatment at 720° C. for two minutes, the resistivity of the device substrate 100 is still greater than the resistivity of the handle substrate 102.

According to the present embodiment, a material of the device substrate 100 and the handle substrate 102 is, for example, silicon, silicon carbide, aluminum oxide (sapphire), gallium nitride, aluminum nitride or other material. In addition, the materials of the device substrate 100 and the handle substrate 102 of the present embodiment may be homogeneous or heterogeneous. If the material of the handle substrate 102 is silicon, the crystal orientation thereof is not particularly limited and may be (100), (110), (111) or the like.

Figure 2:
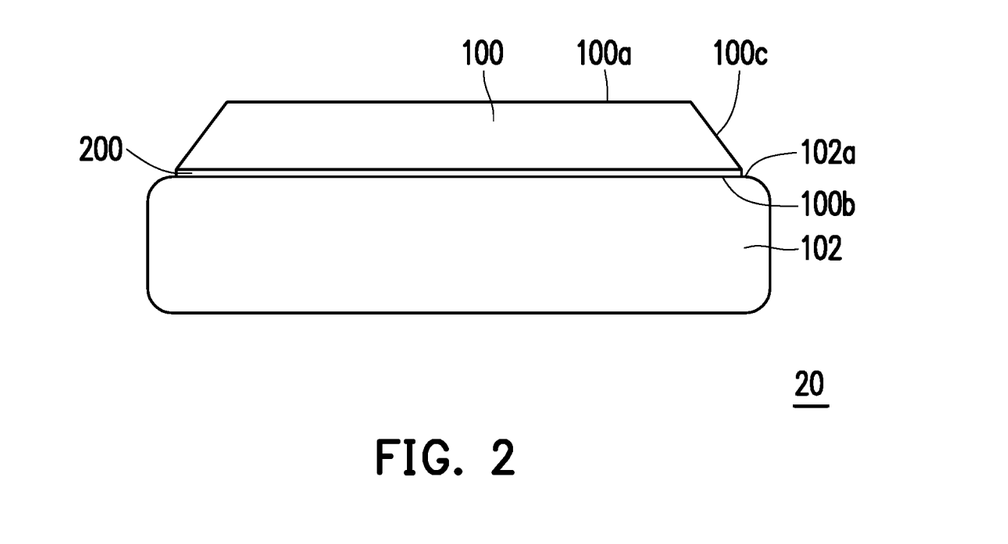
FIG. 2 is a schematic cross-sectional view of an epitaxy substrate according to a second embodiment of the disclosure.

FIG. 2 is a schematic cross-sectional view of an epitaxy substrate according to a second embodiment of the disclosure, wherein the same or similar reference numerals to those of the first embodiment are used to denote the same or similar components, and the description of the same technical content is omitted.

Referring to FIG. 2, an epitaxy substrate 20 of the second embodiment differs from the epitaxy substrate of the first embodiment in that a bonding layer 200 is further disposed between the handle substrate 102 and the device substrate 100, wherein the bonding layer 200 insulates devices to reduce leakage current. A material of the bonding layer 200 is, for example, silicon, silicon dioxide ($SiO_2$), silicon nitride ($Si_3N_4$) or aluminum nitride (AlN).

Figure 3:
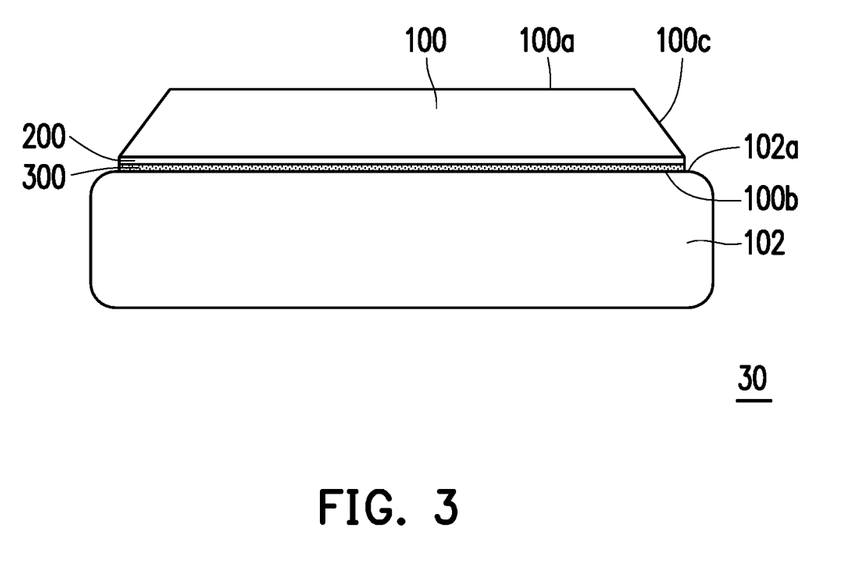
FIG. 3 is a schematic cross-sectional view of an epitaxy substrate according to a third embodiment of the disclosure.

Referring to FIG. 3, an epitaxy substrate 30 of the third embodiment differs from the epitaxy substrate of the second embodiment in that a charge trapping layer 300 is further disposed between the handle substrate 102 and the bonding layer 200. The bonding layer 200 may form a highly conductive charge inversion layer or accumulation layer on an interface between the bonding layer 200 and the handle substrate 102 to decrease the resistivity of the device substrate 100, and the above problem can be avoided by the presence of the charge trapping layer 300.

In some embodiments, the charge trapping layer 300 is a low electron affinity layer. The so-called "low electron affinity" means having lower electron affinity than that of the handle substrate 102. Hence, the low electron affinity layer is capable of suppressing formation of an N-type inversion layer. A material of the low electron affinity layer has, for example, a polycrystalline structure, an amorphous structure, a nanocrystalline structure or a single-crystal structure, and may be selected from the group consisting of $Si_{1-x}Ge_x$, $Si_{1-x}C_x$, $Si_{1-x-y}Ge_xSn_y$, $Si_{1-x-y-z}Ge_xSn_yC_z$, $Ge_{1-x}Sn_x$, group IIIA nitrides and metal oxides, wherein x, y and z are molar ratios having a value between 0 and 1. Examples of the above group IIIA nitrides include GaN, AlN, InN, BN or $Al_{1-x-y-z}Ge_xIn_yB_zN$; examples of the above metal oxides include $SnO_2$, $TiO_2$ or ZnO. In one embodiment, the charge trapping layer 300 is made of a polysilicon layer, and may be disposed as a highly defective layer between the handle substrate 102 and the bonding layer 200. This highly defective layer may be replaced with a surface damage layer formed by implanting heavy ions into a surface 102a of the handle substrate 102. However, the disclosure is not limited thereto.

Figure 4:
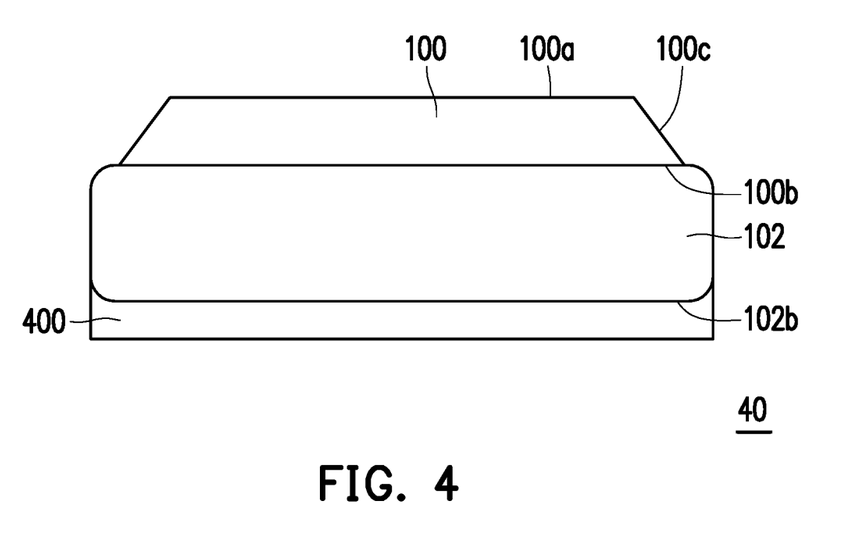
FIG. 4 is a schematic cross-sectional view of an epitaxy substrate according to a fourth embodiment of the disclosure.

Referring to FIG. 4, an epitaxy substrate 40 of the fourth embodiment differs from the epitaxy substrate of the first embodiment in that a protective layer 400 is disposed on a surface (e.g., a back surface 102b) of the handle substrate 102 that is not bonded to the device substrate 100. Due to the presence of the protective layer 400, the stress effect generated in the subsequent epitaxial process can be reduced and the epitaxy substrate 40 can be prevented from cracking. Therefore, in addition to FIG. 4, the protective layer 400 may also be applied to the epitaxy substrate of FIG. 2 or FIG. 3. A material of the protective layer 400 is, for example, $SiO_2$, metal silicides, polysilicon or $Si_3N_4$. The above metal silicides may be transition metal silicides, and examples thereof include nickel silicide, $NiSi_2$, $Ni_2Si$, tungsten silicide, titanium silicide, tantalum silicide or molybdenum silicide. The protective layer 400 reduces the stress effect between the epitaxy substrate 40 and the epitaxial layer, thus preventing the substrate from cracking. In addition, since the polysilicon material or metal silicide material has a good thermomechanical effect, it provides better protection.

Figure 5:
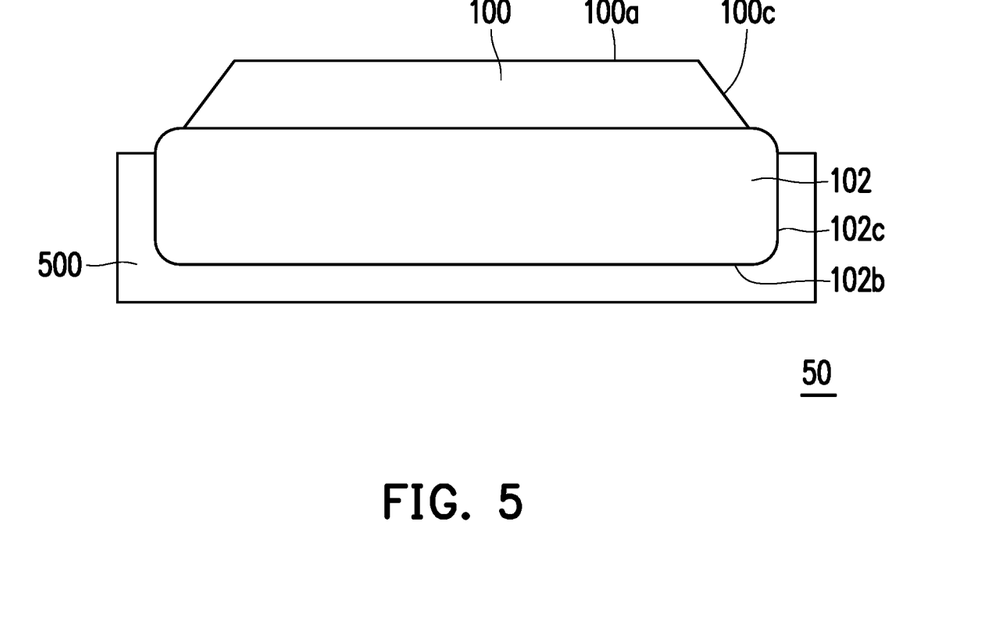
FIG. 5 is a schematic cross-sectional view of an epitaxy substrate according to a fifth embodiment of the disclosure.

Referring to FIG. 5, an epitaxy substrate 50 of the fifth embodiment differs from the epitaxy substrate of the first embodiment in that a protective layer 500 is disposed on a surface (including a side surface 102c and the back surface 102b) of the handle substrate 102 that is not bonded to the device substrate 100. A material of the protective layer 500 is the same as that of the protective layer in the fourth embodiment, and therefore will not be described again. Since the protective layer 500 extends to the side surface 102c of the handle substrate 102, even if the handle substrate 102 is a doped substrate, cracking of the epitaxy substrate 50 and autodoping to the device substrate 100 can both be prevented. Therefore, in addition to FIG. 5, the protective layer 500 may also be applied to the epitaxy substrate of any of FIG. 1 to FIG. 3.

Figure 6:
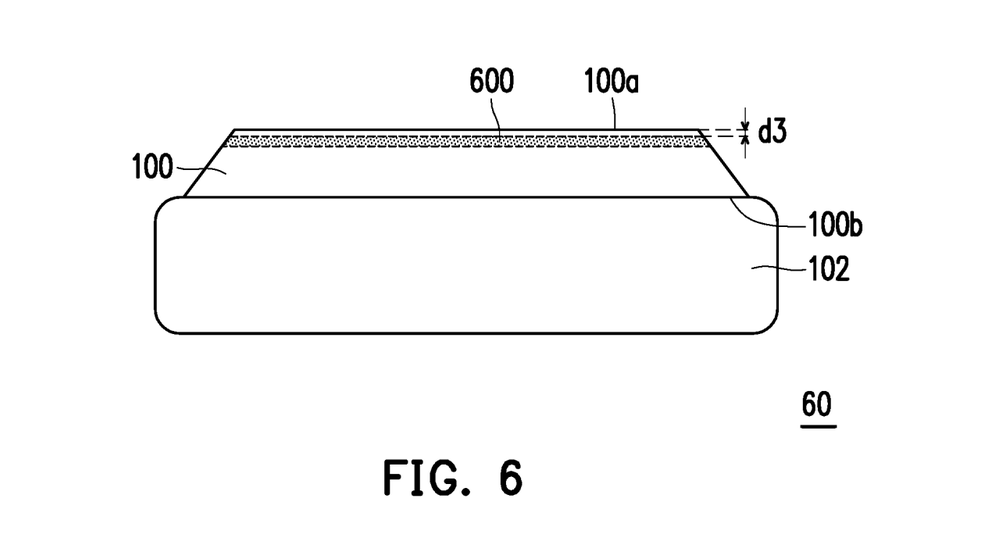
FIG. 6 is a schematic cross-sectional view of an epitaxy substrate according to a sixth embodiment of the disclosure.

Referring to FIG. 6, an epitaxy substrate 60 of the sixth embodiment differs from the epitaxy substrate of the first embodiment in that the epitaxy substrate 60 may further include an implantation region 600 located within the first surface 100a of the device substrate 100. In the present embodiment, a distance d3 between the implantation region 600 and the first surface 100a is approximately 10 nm to 95 nm, and is, for example, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm or 95 nm. Due to the presence of the implantation region 600, defects can be formed to capture electrons, thereby solving the problem of interface loss at an epitaxial interface (i.e., the first surface 100a of the device substrate 100) due to spontaneous or piezoelectric polarization. Therefore, in addition to FIG. 6, the implantation region 600 may also be applied to the epitaxy substrate of any of FIG. 2 to FIG. 5.

Figure 7:
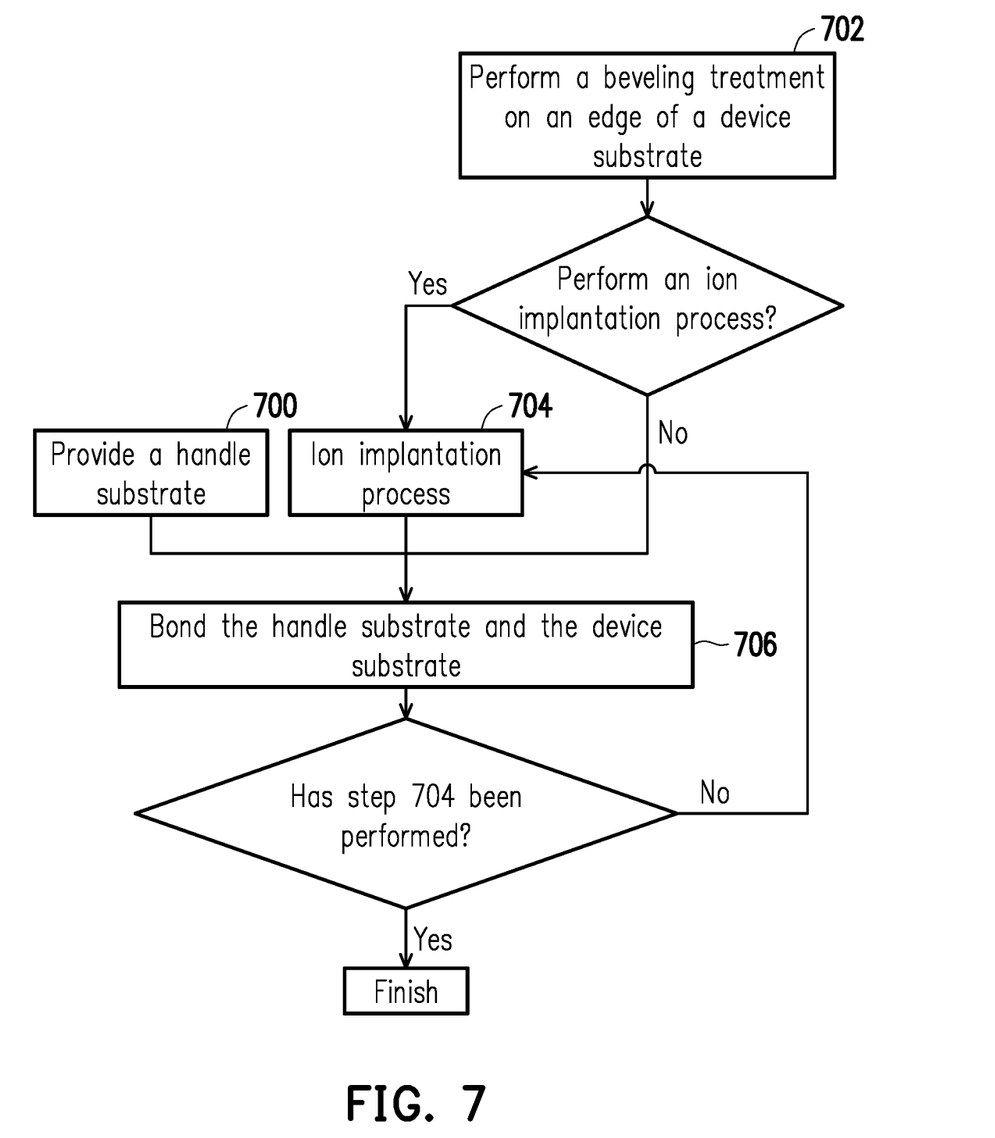
FIG. 7 is a process flow diagram of a process for manufacturing an epitaxy substrate according to a seventh embodiment of the disclosure.

FIG. 7 is a process flow diagram of a process for manufacturing an epitaxy substrate according to a seventh embodiment of the disclosure.

Referring to FIG. 7, since a handle substrate and a device substrate are processed separately, the order of steps 700, 702, and 704 does not matter. That is, in one embodiment, step 700 may be performed first, then steps 702 to 704 are performed, and finally step 706 is performed; in another embodiment, steps 702 to 704 are performed first, and then step 700 is performed, and finally step 706 is performed. In still another embodiment, step 700 may be performed first, then steps 702 and 706 are performed, and finally step 704 is performed; in yet still another embodiment, step 702 may be performed first, then steps 700 and 706 are performed, and finally step 704 is performed.

In step 700, a handle substrate is provided, wherein a material of the handle substrate is, for example, silicon, silicon carbide, aluminum oxide (sapphire), gallium nitride, aluminum nitride or other material. In one embodiment, the handle substrate is, for example, a silicon substrate formed using a Czochralski (CZ) method or a magnetic field applied Czochralski (MCZ) method. However, the disclosure is not limited thereto. In another embodiment, the handle substrate can be strengthened by doping carbon, nitrogen or a combination thereof during crystal growth. In detail, by doping carbon, nitrogen or a combination thereof during crystal growth, precipitation of precipitates such as $SiO_2$ can be facilitated after thermal annealing (rapid thermal annealing (RTA) or rapid thermal processing (RTP)), thereby forming bulk micro defects (BMD) to strengthen the handle substrate. However, if the handle substrate has sufficient oxygen content (e.g., greater than 14 ppma), the doping of carbon, nitrogen or a combination thereof during crystal growth is not required.

In another embodiment, after step 700, a protective layer may further be formed on a surface of the handle substrate that is not bonded to a device substrate. The protective layer is conducive to reducing the stress effect generated in the subsequent epitaxial process, thereby preventing an epitaxy substrate from cracking. A method of forming the protective layer is, for example, chemical vapor deposition (CVD), electrochemical deposition, vapor-liquid-solid deposition, vapor transport deposition, sol-gel, atomic layer deposition (ALD) or plasma-enhanced ALD. In terms of quality of the protective layer, atomic layer deposition (ALD) is preferred. Since the protective layer may extend from a bottom surface to a side surface of the handle substrate, even if the handle substrate is a doped substrate, cracking of the epitaxy substrate and autodoping to the device substrate can both be prevented. The details of the protective layer can be understood by referring to the descriptions of the fourth and fifth embodiments and are thus omitted.

Figure 8A:
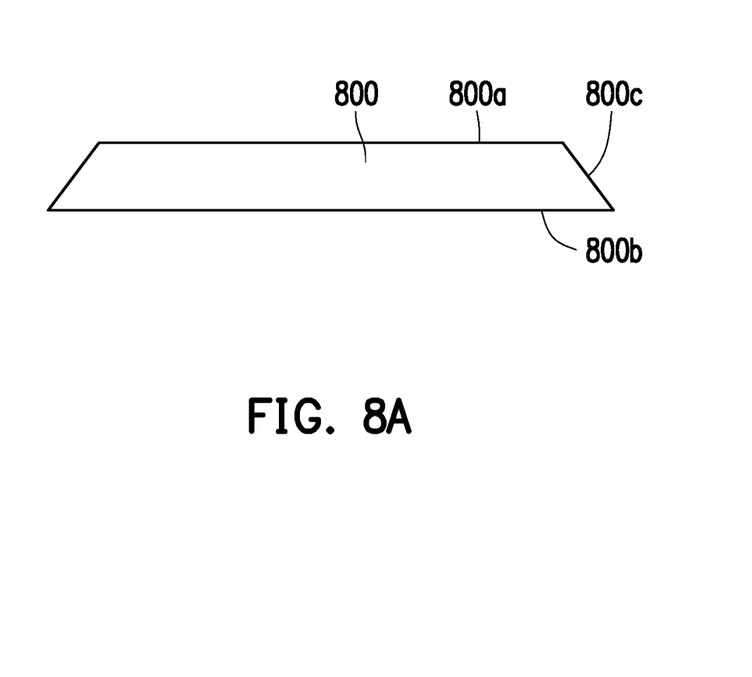
FIG. 8A is a schematic cross-sectional view of a type of device substrate after a beveling treatment in the seventh embodiment.
Figure 8B:
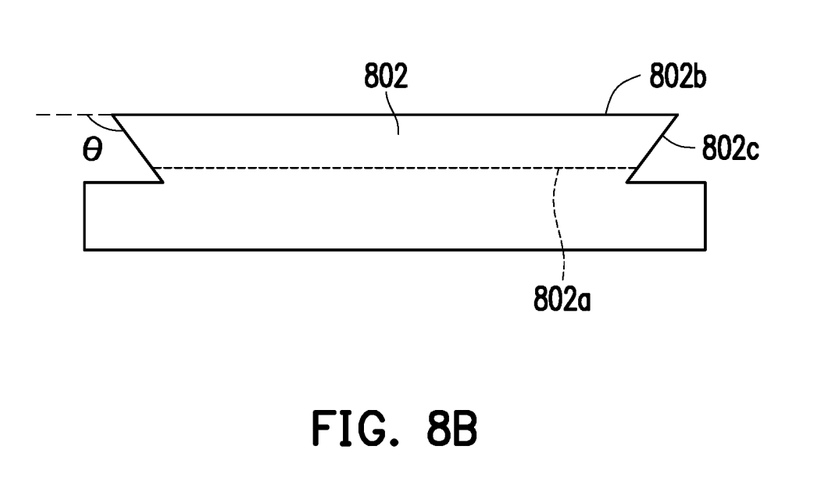
FIG. 8B is a schematic cross-sectional view of another type of device substrate after the beveling treatment in the seventh embodiment.

In step 702, a beveling treatment is performed on an edge of the device substrate such that a bevel is formed at the edge of the device substrate. The above beveling treatment is, for example, laser processing, grinding by a grinding wheel, or computer numerical control (CNC) processing. Moreover, the device substrate after the beveling treatment is as shown in FIG. 8A or FIG. 8B, wherein a device substrate 800 of FIG. 8A has a bevel 800c, and a second surface 800b of the device substrate 800 opposite to a first surface 800a is the surface bonded to the handle substrate. A device substrate 802 of FIG. 8B is processed using, for example, a T-shaped 45 degree round edge grinding wheel, and an angle between a bevel 802c and an intended first surface 802a of the device substrate 802 is equal to the bonding angle θ between a second surface 802b of the subsequent device substrate and the handle substrate. If the device substrate after step 702 (beveling treatment) is the device substrate 802 of FIG. 8B, after subsequent step 706, a step of thinning the device substrate 802 should be added to remove the portion below the first surface 802a (dashed line). In the present embodiment, a material of the device substrate is, for example, silicon, silicon carbide, aluminum oxide (sapphire), gallium nitride, aluminum nitride or other material. In addition, the materials of the device substrate and the handle substrate may be homogeneous or heterogeneous. In one embodiment, the device substrate is, for example, a silicon substrate formed using the FZ method; the handle substrate is, for example, a silicon substrate formed using the CZ method or the MCZ method. Compared to the silicon substrate formed using the CZ method or the MCZ method, the silicon substrate formed using the FZ method may have a very low oxygen content. Thereby, the oxygen content of the device substrate is less than the oxygen content of the handle substrate. However, the disclosure is not limited thereto.

Then, according to actual process requirements, an ion implantation process (step 704) may be performed first, or the device substrate and the handle substrate are bonded prior to the ion implantation process (step 704).

In step 704, the ion implantation process is performed on a first surface of the device substrate to form an implantation region within the first surface. The ion implantation process is, for example, implanting a group IV element or an inert gas. In the present embodiment, a distance between the implantation region and the first surface is, for example, approximately 10 nm to 95 nm. Moreover, after the implantation region is formed, an annealing process may further be performed on the device substrate to repair the first surface of the device substrate. Since defects can be formed by the implantation region to capture electrons, the problem of interface loss at the epitaxial interface due to spontaneous or piezoelectric polarization or diffusion of epitaxial layer atoms to the substrate can be solved. The details of the implantation region can be understood by referring to the description of the sixth embodiment and are thus omitted.

In step 706, a second surface of the device substrate is bonded to the handle substrate to form the epitaxy substrate, wherein a bonding angle greater than 90°, for example, between 100° and 170°, is provided between the bevel of the device substrate and the handle substrate. A bonding method includes pre-bonding and annealing. However, the disclosure is not limited thereto. In one embodiment, in the method of bonding the handle substrate and the device substrate, the bonding between the second surface of the device substrate and the handle substrate may further be performed through a bonding layer. The bonding layer is capable of insulating devices to reduce leakage current. The details of the bonding layer can be understood by referring to the description of the second embodiment and are thus omitted. In addition, since the bonding layer may have a positive charge, a highly conductive charge inversion layer or accumulation layer may be formed at an interface between the bonding layer and the handle substrate, thus decreasing resistivity of the epitaxy substrate and causing parasitic power loss. Therefore, in the case where the bonding layer is provided, a charge trapping layer may be formed on a surface of the handle substrate that is to be bonded to the device substrate before the bonding of the handle substrate and the device substrate. The charge trapping layer can be understood by referring to the description of the third embodiment and an explanation thereof is thus omitted.

In addition, if step 704 has not been performed, step 704 needs to be performed after step 706, so to form the implantation region within the first surface of the device substrate.

Experimental examples are provided below to prove that the handle substrate of the present embodiment is a high-strength handle substrate.

<Experimental Group>

A silicon wafer having a resistivity of 2.5 to 4.5 mohm-cm and a thickness of 725±5 μm was cut into a 2±0.1 cm×6±0.1 cm test piece, and the test piece was placed in the middle of two sapphire columns of 8 mm×8 mm×100 mm in length, width and height. A weight block was further placed on top of the test piece, and a total weight was 500±1 g. After a high-temperature heat treatment at 1,100±5° C. for four hours, a "maximum wafer deformation amount" was measured three times using a dial indicator, and an average value of 6.45 mm was obtained.

<Control Group 1>

The same experimental parameters as those of the experimental group were used except that a silicon wafer having a resistivity of 1 to 15 ohm-cm was used instead. The "maximum wafer deformation amount" was measured three times, and an average value of 6.84 mm was obtained.

<Control Group 2>

The same experimental parameters as those of the experimental group were used except that a silicon wafer having a resistivity of 4,000 to 6,000 ohm-cm was used instead. The "maximum wafer deformation amount" was measured three times, and an average value of 8.10 mm was obtained.

As is clear from the above experimental results, the smaller the resistivity of the handle substrate, the smaller the maximum deformation amount of the handle substrate, and the higher the strength of the handle substrate. It is known from the above experimental group that the maximum deformation amount of the handle substrate of the disclosure is, for example, less than 6.5 mm, preferably 6.45 mm or less.

In summary, in the epitaxy substrate of the disclosure, the device substrate has a bevel, and due to the angle between the bevel and the handle substrate, chipping and contamination can be prevented from occurring at the junction between the device substrate and the handle substrate, and the problem that defects easily occur at a wafer edge during wafer epitaxy can be solved. Moreover, in the disclosure, the oxygen content of the device substrate is less than the oxygen content of the handle substrate, and the oxygen content of the device substrate is small enough (e.g., less than 5 ppma) to prevent the formation of thermal donors and thus to prevent a decrease in the resistivity of the device substrate. In addition, the resistivity of the device substrate is large enough (e.g., greater than 100 ohm-cm) to achieve high resistivity characteristics, which can be applied to RF devices. In addition, by doping during crystal growth, the handle substrate can be strengthened; or, when the oxygen content of the handle substrate is large enough (e.g., greater than 14 ppma), sufficient strength can be provided, thereby realizing an epitaxy substrate having high resistivity, high strength and low oxygen. In addition, by the implantation region located within the device substrate, the problem of interface loss at the epitaxial interface due to spontaneous or piezoelectric polarization or diffusion of epitaxial layer atoms to the substrate can be solved. By the bonding layer provided between the device substrate and the handle substrate, leak current can be reduced. In order to prevent formation of a highly conductive charge inversion layer at the interface between the bonding layer and the handle substrate, in the disclosure, the charge trapping layer may be disposed between the bonding layer and the handle substrate. In addition, by disposing the protective layer on the back surface or side surface of the handle substrate, the stress effect generated in the epitaxial process can be reduced and the epitaxy substrate can be prevented from cracking.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An epitaxy substrate, comprising:
    a device substrate, having a first surface and a second surface opposite to each other, and a bevel disposed between the first surface and the second surface; and
    a handle substrate, bonded to the second surface of the device substrate, wherein an oxygen content of the device substrate is less than an oxygen content of the handle substrate, and a bonding angle greater than 90° is provided between the bevel of the device substrate and the handle substrate,
    wherein a projection length of the bevel toward the handle substrate is between 600 μm and 800 μm,
    wherein a thickness of the device substrate is greater than 100 μm and less than 200 μm.

2. The epitaxy substrate of claim 1, wherein a resistivity of the device substrate is greater than a resistivity of the handle substrate.

3. The epitaxy substrate of claim 2, wherein after annealing at 450° C. for one hour, the resistivity of the device substrate is greater than the resistivity of the handle substrate.

4. The epitaxy substrate of claim 2, wherein after a heat treatment at 720° C. for two minutes, the resistivity of the device substrate is greater than the resistivity of the handle substrate.

5. The epitaxy substrate of claim 1, wherein a resistivity of the device substrate is greater than 100 ohm-cm.

6. The epitaxy substrate of claim 1, wherein an error value of crystal orientation of the device substrate is less than ±0.05 degree.

7. The epitaxy substrate of claim 1, wherein the bonding angle is 100° to 170°.

8. The epitaxy substrate of claim 1, wherein the oxygen content of the device substrate is less than 5 ppma.

9. The epitaxy substrate of claim 1, further comprising a bonding layer disposed between the handle substrate and the device substrate.

10. The epitaxy substrate of claim 9, further comprising a charge trapping layer disposed between the handle substrate and the bonding layer.

11. The epitaxy substrate of claim 1, further comprising a protective layer disposed on a surface of the handle substrate that is not bonded to the device substrate.

12. The epitaxy substrate of claim 1, wherein a diameter of the handle substrate and a diameter of the second surface of the device substrate are different by 0.2 mm or more.

13. The epitaxy substrate of claim 1, further comprising an implantation region located within the first surface of the device substrate, wherein a distance between the implantation region and the first surface is 10 nm to 95 nm.

14. The epitaxy substrate of claim 1, wherein a maximum deformation amount of the handle substrate is less than 6.5 mm.

* * * * *